United States Patent [19]

Umezawa

[11] Patent Number: 5,036,384
[45] Date of Patent: Jul. 30, 1991

[54] COOLING SYSTEM FOR IC PACKAGE

[75] Inventor: Kazuhiko Umezawa, Tokyo, Japan

[73] Assignee: NEC Corporation, Tokyo, Japan

[21] Appl. No.: 515,358

[22] Filed: Apr. 30, 1990

Related U.S. Application Data

[63] Continuation of Ser. No. 280,354, Dec. 6, 1988, abandoned.

[30] Foreign Application Priority Data

Dec. 7, 1987 [JP] Japan ................ 60-310187

[51] Int. Cl.$^5$ ............................. H01L 25/04
[52] U.S. Cl. ...................... 357/82; 357/79; 365/185
[58] Field of Search ............. 357/82, 79; 361/385

[56] References Cited

U.S. PATENT DOCUMENTS

| | | | |
|---|---|---|---|
| 2,357,706 | 9/1944 | Toepperwein ............... | 156/80 |
| 2,783,418 | 2/1957 | Peter et al. ................ | 165/80 |
| 2,999,034 | 9/1961 | Heidenhain ................ | 29/840 |
| 3,205,469 | 9/1965 | Frank et al. ............... | 165/80 |
| 3,211,969 | 10/1965 | Colaiaco ................... | 165/80 |
| 3,651,865 | 3/1972 | Feldmanis ................. | 165/80 |
| 3,777,220 | 12/1973 | Tatusko et al. ............ | 317/104 |
| 3,827,457 | 8/1974 | Vutz et al. ................ | 137/599 |
| 3,881,181 | 4/1975 | Khajezadeh ............... | 357/69 |
| 3,908,188 | 9/1975 | Kawamoto ................. | 357/82 |
| 3,912,001 | 10/1975 | Missman et al. ............ | 165/80 |
| 3,993,123 | 11/1975 | Chu et al. ................. | 165/80 |
| 4,037,270 | 5/1977 | Ahman et al. .............. | 361/385 |
| 4,093,971 | 6/1978 | Chu et al. ................. | 165/80 |
| 4,109,707 | 8/1978 | Wilson et al. .............. | 165/46 |
| 4,110,549 | 8/1978 | Goetzke et al. ............ | 174/16 |
| 4,115,836 | 9/1978 | Hutchison et al. ........... | 361/382 |
| 4,158,875 | 6/1979 | Tajima et al. .............. | 361/384 |
| 4,167,031 | 9/1979 | Patel ...................... | 365/182 |
| 4,196,775 | 4/1980 | Groh ....................... | 165/68 |
| 4,204,246 | 5/1980 | Arii et al. ................. | 361/385 |
| 4,226,281 | 10/1980 | Chu ........................ | 165/80 |
| 4,245,273 | 1/1981 | Feinberg et al. ............ | 361/382 |
| 4,282,924 | 8/1981 | Faretra ..................... | 165/80 |

(List continued on next page.)

FOREIGN PATENT DOCUMENTS

| | | |
|---|---|---|
| 2926403 | 6/1979 | Fed. Rep. of Germany . |
| 55-86130 | 6/1980 | Japan . |
| 56-70655 | 6/1981 | Japan . |
| 57106062 | 7/1982 | Japan . |
| 59-130450 | 7/1984 | Japan . |
| 60-160150 | 8/1985 | Japan . |
| 60-257156 | 12/1985 | Japan . |
| 61-171157 | 8/1986 | Japan . |
| 61-226946 | 10/1986 | Japan . |
| 61-276242 | 12/1986 | Japan . |
| 63-81959 | 4/1988 | Japan ................ 357/82 |
| 63-226049 | 9/1988 | Japan . |
| 63-308943 | 12/1988 | Japan . |
| 572951 | 9/1977 | U.S.S.R. . |

OTHER PUBLICATIONS

IBM Technical Disclosure Bulletin, "Module Package", by R. R. Dion et al., vol. 7, No. 7, Dec. 1964.
A Scientific American Book, "Microelectronics",
(List continued on next page.)

Primary Examiner—Jerome Jackson, Jr.
Assistant Examiner—Donald L. Monin
Attorney, Agent, or Firm—Burns, Doane, Swecker & Mathis

[57] ABSTRACT

A cooling system for an IC package includes a support plate arranged to oppose a wiring board on which a plurality of integrated circuits are mounted, a plurality of cooling plates fixed to the support plate by support members and each having a coolant channel therein, the cooling plates being arranged in a one-to-one correspondence with the integrated circuits, flexible coolant pipes each connecting the coolant channels of adjacent cooling plates, heat conduction members each formed on a surface of each cooling plate, and elastic members disposed between the support plate and the cooling plates to urge the cooling plates against the integrated circuits through the heat conduction members, respectively, thereby independently urging the cooling plates against the corresponding integrated circuits so as to independently cool the integrated circuits.

2 Claims, 5 Drawing Sheets

U.S. PATENT DOCUMENTS

| | | | |
|---|---|---|---|
| 4,381,032 | 4/1983 | Cutchaw | 165/46 |
| 4,398,208 | 8/1983 | Murano et al. | 361/382 |
| 4,439,918 | 4/1984 | Carroll, II et al. | 29/840 |
| 4,467,522 | 8/1984 | Marchisi | 29/827 |
| 4,468,717 | 8/1984 | Mathias et al. | 361/382 |
| 4,493,010 | 1/1985 | Morrison et al. | 361/385 |
| 4,498,122 | 2/1985 | Rainal | 361/414 |
| 4,509,086 | 4/1985 | Baldwin et al. | 361/386 |
| 4,535,385 | 8/1985 | August et al. | 361/388 |
| 4,536,824 | 8/1985 | Barrett et al. | 361/384 |
| 4,546,410 | 10/1985 | Kaufman | 361/387 |
| 4,574,879 | 3/1986 | DeGree et al. | 156/185 |
| 4,588,023 | 5/1986 | Munekawa | 165/104.3 |
| 4,602,125 | 7/1986 | West et al. | 174/138 |
| 4,602,678 | 7/1986 | Fick | 165/79 |
| 4,628,990 | 12/1986 | Hagihara et al. | 165/80.4 |
| 4,638,404 | 1/1987 | Grossmann et al. | 357/82 |
| 4,641,176 | 2/1987 | Keryhuel et al. | 357/74 |
| 4,644,385 | 2/1987 | Nakanishi et al. | 357/82 |
| 4,666,545 | 5/1987 | DeGree et al. | 156/252 |
| 4,685,211 | 8/1987 | Hagihara et al. | 29/832 |
| 4,686,606 | 8/1987 | Yamada et al. | 361/385 |
| 4,689,659 | 8/1987 | Watanabe | 357/81 |
| 4,712,158 | 12/1987 | Kikuchi et al. | 165/80.4 |
| 4,721,996 | 1/1988 | Tustaniwsky et al. | 357/82 |
| 4,724,611 | 2/1988 | Hagihara | 28/840 |
| 4,727,554 | 2/1988 | Watanabe | 372/36 |
| 4,729,424 | 3/1988 | Mizuno et al. | 165/185 |
| 4,744,007 | 5/1988 | Watari et al. | 361/386 |
| 4,750,086 | 6/1988 | Mittal | 361/382 |
| 4,768,352 | 9/1988 | Maruyama | 62/383 |
| 4,781,244 | 11/1988 | Kuramitsu et al. | 165/80.4 |
| 4,783,721 | 11/1988 | Yamamoto et al. | 361/382 |
| 4,791,983 | 12/1988 | Nicol et al. | 165/80.4 |
| 4,794,981 | 1/1989 | Mizuno | 165/80.4 |
| 4,884,167 | 11/1989 | Mine | 361/382 |

OTHER PUBLICATIONS cover pages 51 and 166, Assembly Techniques, pp. 404–420.

IBM Technical Disclosure Bulletin, vol. 18, No. 12, pp. 3982–3983, "Heat-Pipe Cool Stacked Electronic Wafer Package", Kerjilian et al., May 1976.

Electronics, "Supercomputers Demand Innovation in Packaging and Cooling", Lyman, pp. 136–144, Sep. 22, 1982.

"A Conduction-Cooled Module for High-Performance LSI Devices", Oktay et al., IBM J. Res. Develop., vol. 26, No. 1, pp. 55–66 (Jan. 1982).

*IBM Technical Disclosure Bulletin*, "Compliant Cold Plate Cooling Scheme", Antonetti et al., vol. 21, No. 6, p. 2431 (Nov. 1978).

IEEE International Conference on Computer Design; VLSI in Computers ICCD '83 Session: The New IBM 4381, 3 pages (Nov. 1, 1983).

IEEE International Conference on Computer Design: VLSI in Computers ICCD '83 Session: "New Internal and External Cooling Enhancements for the Air–Cooled IBM 4381 Module", Oktay, et al.; four pages (Nov., 1983).

"Electrical Design and Analysis of the Air-Cooled Module (ACM) in IBM System/4381", Cherensky et al., IEEE International Conference on Computer Design: VLSI in Computers, ICCD '83, six pages (Nov. 1, 1983).

"Hermetic Tin/Lead Solder Sealing for the Air–Cooled IBM 4381 Module", Brady et al., IEEE International Conference on Computer Design, VLSI in Computers, ICCD'83, Session: The New IBM 4381, four pages (Nov. 1, 1983).

IBM Technical Disclosure Bulletin, "Counter-Flor Cooling System", vol. 8, No. 11, Apr. 1966.

IBM Technical Disclosure Bulletin, vol. 20, No. 4, Sep. 1977, "Method of Effective Cooling of a High Power Silicon Chip", Doo et al.

IBM Technical Disclosure Bulletin, vol. 20, No. 11A, Apr. 1978, "Three-Dimentional MLC Substrate Integrated Circuit Support Package", Aichelman et al.

IBM Technical Disclosure Bulletin, vol. 20, No. 11A, Apr. 1978, "Conduction-Cooling Module", Hwang et al.

IBM Technical Disclosure Bulletin, vol. 21, No. 6, Nov. 1978, "Solid Encapsulated Module", Chu et al.

IEEE Transactions on Components, Hybrids and Manufacturing Technology, vol. C, No. 3, Sep. 1979, "Bumped Tape Automated Bonding (BTAB) Practical Application Guidelines", Kanz et al.

IEEE Transactions on Components, Hybrids, and Manufacturing Technology, vol. CHMT-3, No. 1, Mar. 1980, "IBM Multichip Ceramic Modules for LSI Chips".

COOLING SYSTEM FOR IC PACKAGE

This application is a continuation of application Ser. No. 280,354, filed Dec. 6, 1988 now abandoned.

BACKGROUND OF THE INVENTION

The present invention relates to a cooling system for an IC package used in electronic equipment such as an information processor.

Many conventional cooling systems for an IC package employ a cooling scheme wherein a plurality of printed boards each mounting ICs thereon are accommodated in shelves and are cooled by forced convection of air by cooling fans. A forced air cooling scheme of this type is required to deliver a large quantity of air to electronic equipment since recent electronic equipment has a higher heat generation density due to use of LSIs (Large Scale ICs). When the capacity of the forced air cooling system is increased, a high-power cooling fan used therein poses a noise problem. Therefore, the cooling capacity of the cooling system of this type has almost reached maximum capacity.

In another cooling system, a liquid coolant such as water having a heat capacity larger than that of air is circulated near ICs, and metal parts are located in contact with cases of the ICs to conduct heat from the ICs to the coolant, thereby dissipating heat. A typical example of such a cooling system is disclosed in Special Report "SUPERCOMPUTERS DEMAND INNOVATION IN PACKAGING AND COOLING", ELECTRONICS/Sept. 22, 1982, PP. 142-143. In this literature, a plurality of LSIs are brought into contact with a cold plate having a water channel in which a coolant flows, thereby cooling the LSIs.

Heights of LSIs are not necessarily identical due to variations in dimensional precision of parts, mounting variations, warping of a printed board, and the like and cannot be aligned on an identical plane. For this reason, a thermal paste sealed in a film is mounted on a surface of a cold plate which is in contact with an LSI, and variations in LSI heights are absorbed by flexibility of the thermal paste. However, when variations in heights of LSIs exceed a predetermined range and cannot be absorbed by a material such as a thermal paste, air which has a poor heat conduction property is present in a heat conduction path between the LSI and the cold plate, thus degrading the cooling effect.

SUMMARY OF THE INVENTION

It is an object of the present invention to eliminate the conventional drawbacks described above and to provide a cooling system for an IC package which can absorb variations in heights of IC devices mounted on a printed board regardless of the magnitude of variations without degrading the heat conduction property of the cooling system.

In order to achieve the above object of the present invention, there is provided a cooling system for an IC package, comprising a support plate arranged to oppose a wiring board on which a plurality of integrated circuits are mounted, a plurality of cooling plates fixed to the support plate by support members and each having a coolant channel therein, the plurality of cooling plates being arranged in a one-to-one correspondence with the plurality of integrated circuits, flexible coolant pipes each connecting the coolant channels of adjacent ones of the cooling plates, heat conduction members each formed on a surface of each of the cooling plates, and elastic members disposed between the support plate and the cooling plates to urge the cooling plates against the integrated circuits through the heat conduction members, respectively, thereby independently urging the cooling plates against the corresponding integrated circuits so as to independently cool the integrated circuits.

DETAILED DESCRIPTION OF THE PREFERRED EMBODIMENTS

The present invention will be described with reference to the accompanying drawings.

Figure 1:
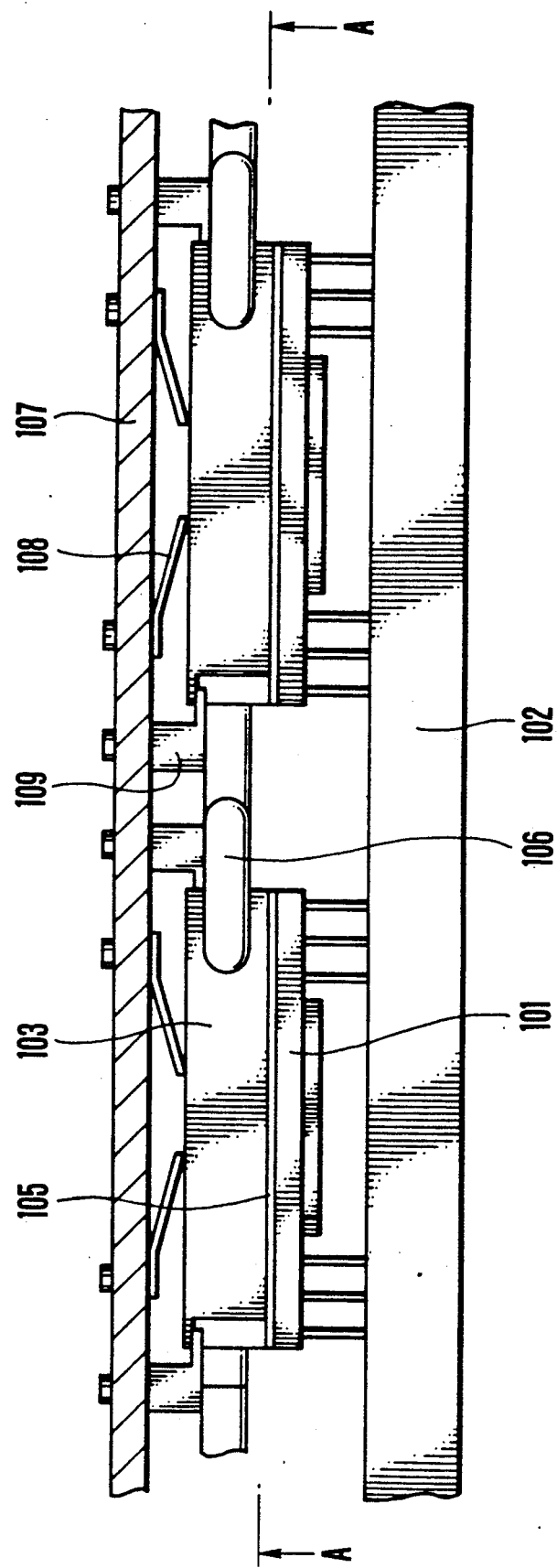
FIG. 1 is a sectional view of a cooling system for an IC package according to an embodiment of the present invention.
Figure 2:
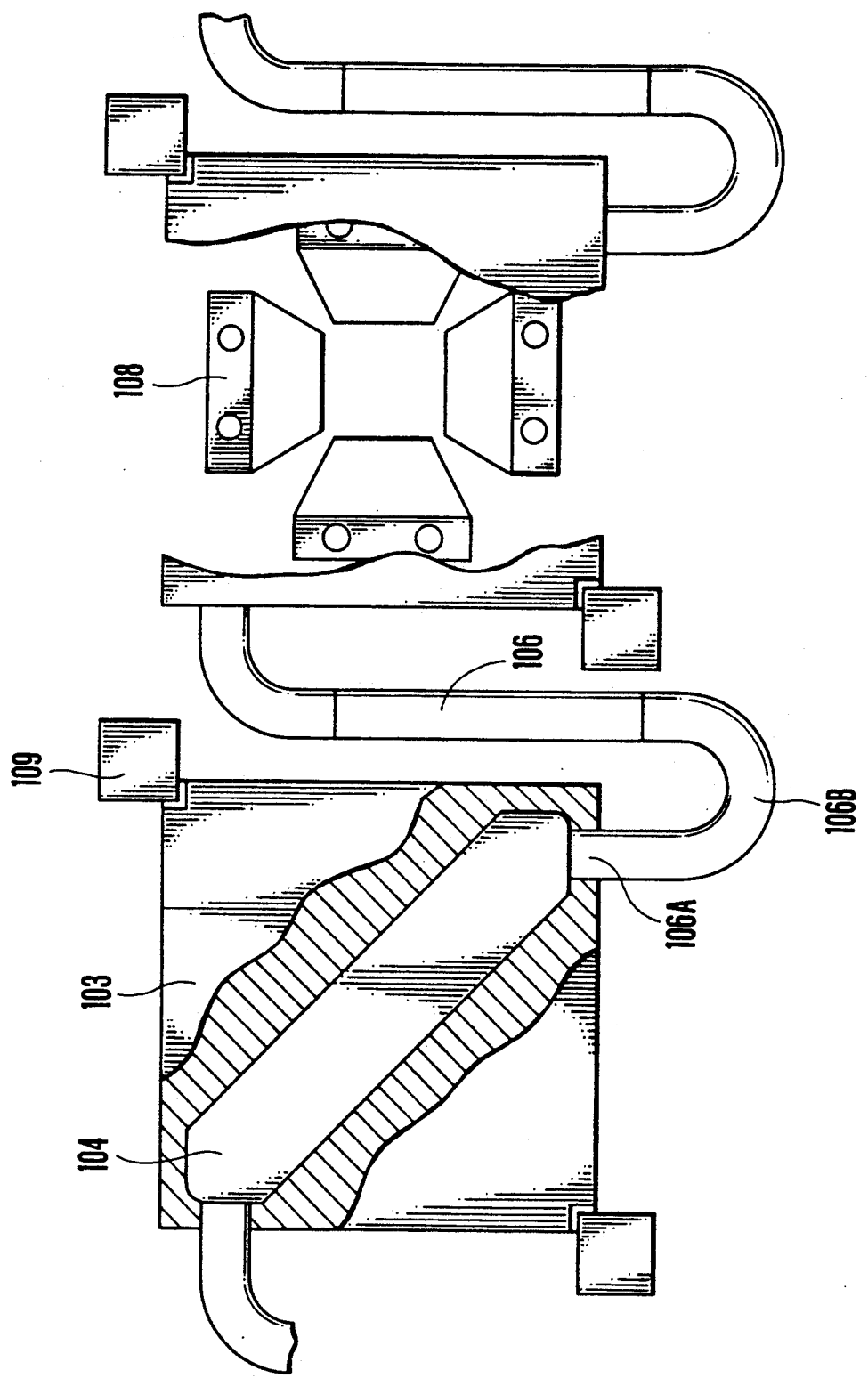
FIG. 2 is a sectional view of the cooling system in FIG. 1 along the line A—A thereof.

FIG. 1 is a longitudinal sectional view of a cooling system for an IC package according to an embodiment of the present invention, and FIG. 2 is a sectional view thereof along the line A—A in FIG. 1.

Reference numeral 101 denotes an integrated circuit (IC) housed in a package; and 102, a wiring board on which a plurality of ICs are mounted. Reference numeral 103 denotes a metal cold plate serving as a cooling plate, having a coolant channel 104 therein, for cooling the corresponding IC 101. The cold plates 103 are arranged in a one-to-one correspondence with the ICs 101. A heat conduction member 105 is arranged between the IC 101 and the cooling plate 103 to absorb small warping of opposite surfaces of the IC 101 and the cooling plate 103. The heat conduction member 105 may be a paste- or soft sheet-like member (e.g., a material prepared by mixing a metal oxide or boron nitride in silicone rubber or silicone oil).

Reference numeral 106 denotes a coolant pipe for connecting coolant channels 104 of the adjacent cooling plates 103. A connection portion 106A of the coolant pipe 106 is connected to the corresponding cooling plate 103 by brazing. A remaining portion 106B of the coolant pipe 106 comprises a flexible tube. Reference numeral 107 denotes a support plate parallel to the wiring board 102 and spaced apart therefrom by a predetermined distance. Leaf springs 108 each having one end fixed to the support plate 107 are interposed between the support plate 107 and the corresponding cooling plate 103 to urge the cooling plate 103 toward the corresponding IC 101. The cooling plate 103 is fixed by support members 109 so as not to be separated from the corresponding support plate 107.

Heat generated by the ICs 101 is conducted to the corresponding cooling plates 103 through the corresponding heat conduction members 105 and is then dissipated to a coolant flowing through the corresponding coolant channels 104.

Figure 3:
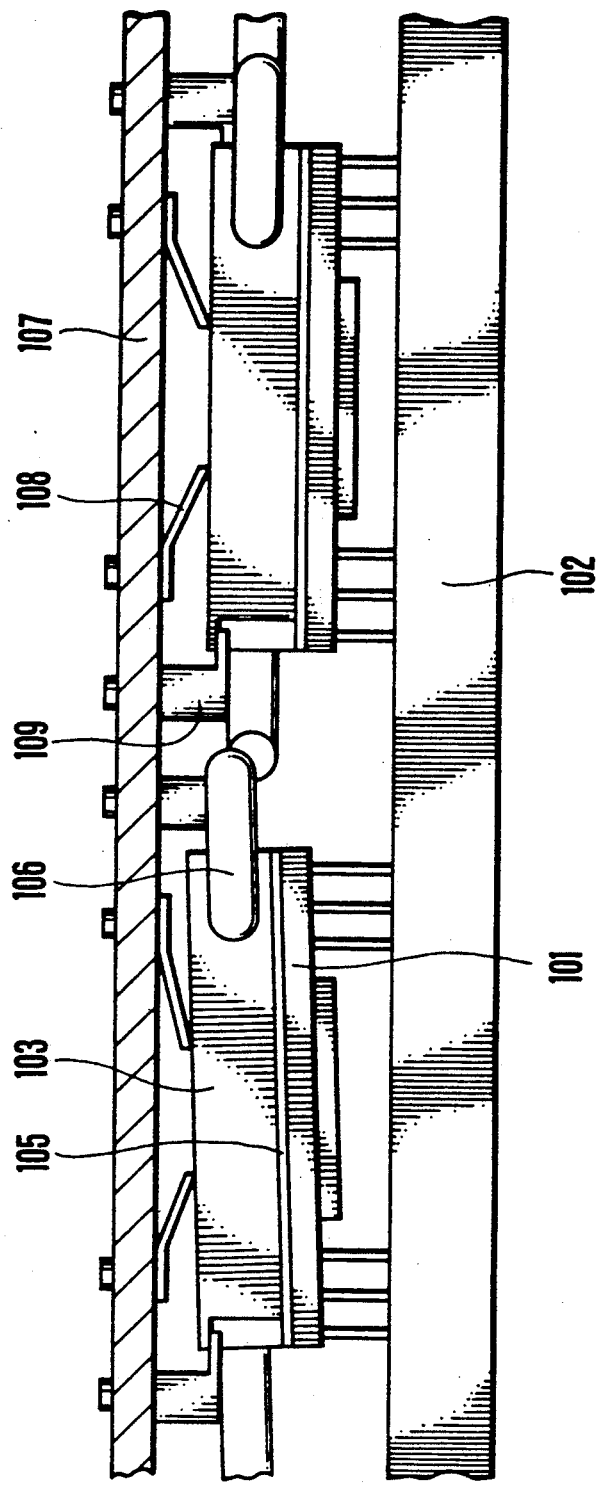
FIG. 3 is a longitudinal sectional view showing a case wherein one of ICs of the embodiment of FIG. 1 is inclined.

As shown in FIG. 3, even if variations in the dimensional precision of parts, mounting variations, and warping of the wiring board 102 are present, and the ICs 101 are inclined at different angles, the leaf springs 108 are elastically deformed to keep the opposite surfaces of the cooling plate 103 and the IC 101 parallel to each other. The coolant pipe 106 which connects the adjacent cooling plates 103 has a flexible structure. Since all the cooling plates 103 are moved independently of each other, the cooling system can cope with large different heights of the adjacent ICs. Therefore, air which has a poor heat conduction property is not present in a heat conduction path between the IC 101 and the cooling plate 103, and the IC 101 can be effectively maintained at a low temperature.

Figure 4:
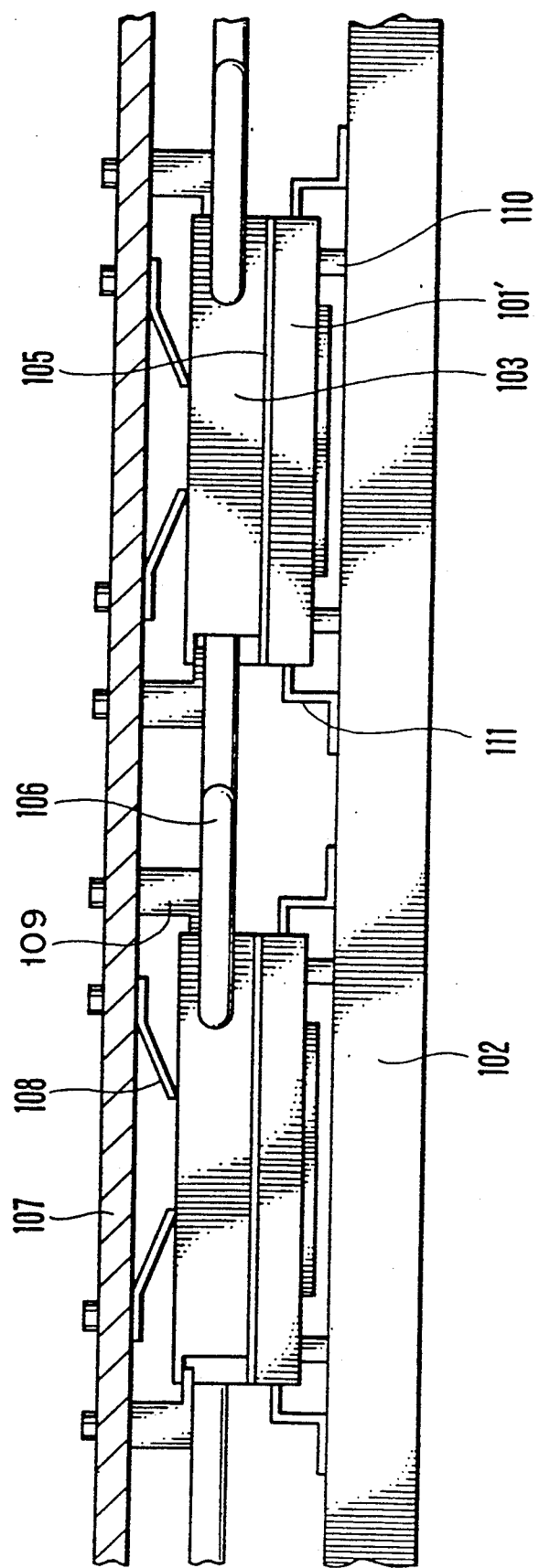
FIG. 4 is a longitudinal sectional view showing a cooling system for an IC package according to another embodiment of the present invention.

FIG. 4 is a longitudinal sectional view of a cooling system for an IC package according to another embodiment of the present invention.

Figure 5:
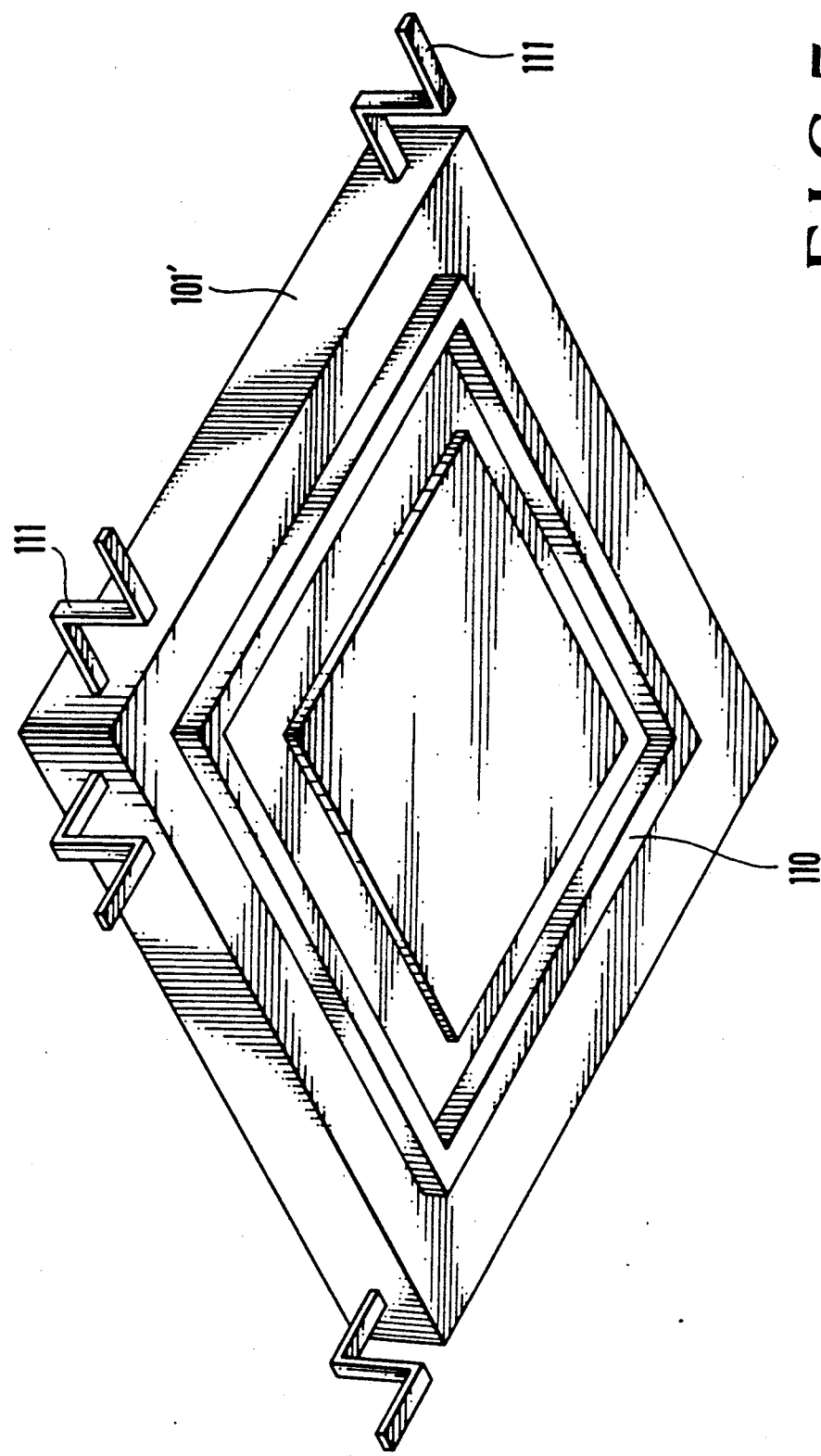
FIG. 5 is a perspective view showing an IC structure shown in FIG. 4.

FIG. 5 is a perspective view of the system when an IC 101' is observed from the side of a wiring board 102.

One end of each of Z-shaped leads 111 is connected to a corresponding side surface of the IC 101', and the other end of each of the leads 111 is connected to the wiring board 102. A stopper 110 is fixed on the surface (i.e., lower surface in FIGS. 4 and 5) of the IC 101' the side opposite to the wiring board 102. The stopper 110 attached to the IC 101' can prevent flexure of the leads 111 because the stopper 110 is brought into contact with the wiring board 102 even if forces of the leaf springs 108 which are generated by variations in IC heights are applied to the IC 101'. Therefore, excessive forces do not act on the leads 111.

According to the present invention as described above, the leaf springs arranged between each cooling plate having the coolant channel therein and the support plate urge the IC through the corresponding cooling plate. Each coolant pipe which connects the adjacent cooling plates has flexibility, and the cooling plates can be independently displaced. Therefore, even if variations in dimensional precision of parts, mounting variations, warping of the wiring board having ICs thereon are present or the heights and inclinations of the ICs are not uniform, each cooling plate can be in tight contact with the corresponding IC through the corresponding heat conduction member. Therefore, air having a poor heat conduction property is not present in a heat conduction path between each IC and the corresponding cooling plate, and the IC can be efficiently kept at a low temperature.

What is claimed is:

1. A cooling system for an IC package, comprising:
   a wiring board on which a plurality of integrated circuits are mounted;
   a support plate arranged to oppose said wiring board;
   a plurality of pairs of support members, each pair of support members connected between said support plate and a cooling plate, one support member of each pair being connected to opposite sides of the periphery of said cooling plate;
   a plurality of heat conduction members connected to respective ones of said plurality of integrated circuits on a side opposite to said wiring board;
   a plurality of said cooling plates connected to said support plate by support members and also to respective ones of said plurality of heat conduction members, each of said cooling plates having a coolant channel therein and a coolant inlet and a coolant outlet which are in substantially parallel relation to said wiring board, said plurality of cooling plates being arranged in a one-to-one correspondence with the plurality of integrated circuits;
   flexible coolant pipes, each of said flexible coolant pipes connecting said coolant outlet of one of said cooling plates to said coolant inlet of an adjacent one of said cooling plates, said flexible coolant pipes being in substantially parallel relation to said wiring board; and
   a plurality of pairs of elastically deformed leaf springs, each pair being disposed between said pair of support members and having one end connected to said support plate and a second end abutting one side of said cooling plates opposite to a side connected to said heat conduction members to respectively urge said cooling plates against the integrated circuits through said heat conduction members, thereby independently urging said cooling plates against the corresponding integrated circuits so as to independently cool the integrated circuits.

2. A cooling system according to claim 1, further comprising: a pair of leads operatively connecting each of said integrated circuits to said wiring board and a pair of stoppers mounted between said pair of leads on a surface of each of said integrated circuits on a side opposing said wiring board connecting each of said integrated circuits with said wiring board in accordance with a distance to be maintained between each integrated circuit and said wiring board.

* * * * *

UNITED STATES PATENT AND TRADEMARK OFFICE
CERTIFICATE OF CORRECTION

PATENT NO. : 5,036,384
DATED : July 30, 1991
INVENTOR(S) : Kazuhiko UMEZAWA

It is certified that error appears in the above-identified patent and that said Letters Patent is hereby corrected as shown below:

On the Title page

Foreign priority data is changed to:

[30]  Dec. 7, 1987  [JP]  .......... 62-310187

Signed and Sealed this

Twenty-sixth Day of January, 1993

Attest:

STEPHEN G. KUNIN

*Attesting Officer*    Acting Commissioner of Patents and Trademarks